United States Patent [19]

Urano et al.

[11] Patent Number: 5,780,206
[45] Date of Patent: Jul. 14, 1998

[54] FINE PATTERN FORMING PROCESS USING A RESIST COMPOSITION SENSITIVE TO DEEP ULTRAVIOLET LIGHT

[75] Inventors: Fumiyoshi Urano; Takanori Yasuda, both of Kawagoe; Akiko Katsuyama, Moriguchi; Kazuhiro Yamashita, Amagasaki, all of Japan

[73] Assignees: Wako Pure Chemical Industries, Ltd., Osaka; Matsushita Electric Industrial Co., Ltd., Kadoma, both of Japan

[21] Appl. No.: 898,086

[22] Filed: Jul. 23, 1997

Related U.S. Application Data

[62] Division of Ser. No. 702,805, Aug. 26, 1996, Pat. No. 5,695,910, which is a continuation of Ser. No. 407,946, Mar. 22, 1995.

[30] Foreign Application Priority Data

Mar. 28, 1994 [JP] Japan ................... 6-080957

[51] Int. Cl.⁶ .................. G03F 7/30; G03F 1/52
[52] U.S. Cl. .................. 430/325; 430/170; 430/270.1; 430/326; 430/330; 430/512; 430/905; 430/926; 430/927
[58] Field of Search .................. 430/325, 326, 430/945, 170, 270.1, 512, 905, 926, 927, 330

[56] References Cited

U.S. PATENT DOCUMENTS

| | | |
|---|---|---|
| 5,059,512 | 10/1991 | Babich et al. |
| 5,250,395 | 10/1993 | Allen et al. |
| 5,272,042 | 12/1993 | Allen et al. |
| 5,376,498 | 12/1994 | Kajita et al. |
| 5,695,910 | 12/1997 | Urano et al. ............ 430/270.1 |

FOREIGN PATENT DOCUMENTS

| | | |
|---|---|---|
| 174 271 | 8/1985 | European Pat. Off. |
| 422 570 | 10/1990 | European Pat. Off. |
| 543 762 | 10/1992 | European Pat. Off. |
| 542 008 | 5/1993 | European Pat. Off. |
| 543 762 | 5/1993 | European Pat. Off. |
| 636 941 | 2/1995 | European Pat. Off. |
| 3-177015 | 8/1991 | Japan. |

*Primary Examiner*—John S. Chu
*Attorney, Agent, or Firm*—Armstrong, Westerman, Hattori, McLeland & Naughton

[57] ABSTRACT

A resist composition for deep ultraviolet light comprising (a) one of the following resin components (i)–(iii): (i) a resin which becomes alkali-soluble by eliminating protective groups by the action of an acid, (ii) a combination of an alkali-soluble resin and a dissolution-inhibiting compound, and (iii) a combination of an alkali-soluble resin and a crosslinkable compound, (b) an acid generater, (c) a special anthracene derivative, and (d) a solvent, is suitable for forming a pattern using deep ultraviolet light, KrF excimer laser light, etc., on a highly reflective substrate having level differences due to absorption of undesirable reflected deep ultraviolet light.

2 Claims, 1 Drawing Sheet

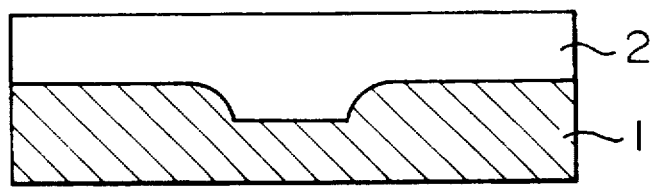
FIG. IA
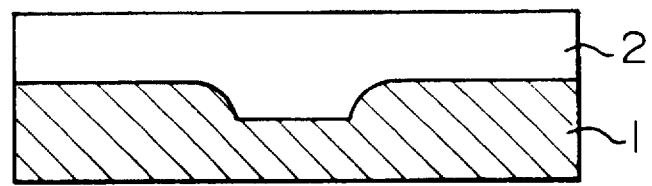
FIG. IB
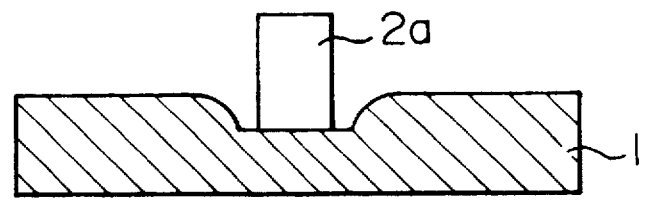
FIG. IC
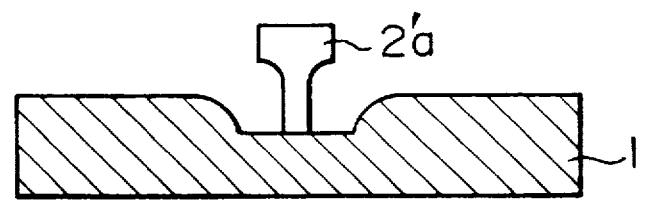
FIG. 2

FINE PATTERN FORMING PROCESS USING A RESIST COMPOSITION SENSITIVE TO DEEP ULTRAVIOLET LIGHT

This is a division of application Ser. No. 08/702,805 filed Aug. 26, 1996 now U.S. Pat. No. 5,895,913 which was a continuation of application Ser. No. 08/407,946 filed Mar. 22, 1995.

BACKGROUND OF THE INVENTION

The present invention relates to a resist composition used in production of semiconductor devices such as IC and LSI, and a fine pattern forming method using such a resist composition. More particularly, the invention pertains to a chemically amplified positive (or negative) resist composition which finds particularly useful application where a fine pattern is formed on a high-reflectance substrate made of such material as aluminum, polysilicon, aluminum-silicon, tungsten silicide or the like by using deep ultraviolet light (300 nm or less in wavelength), KrF excimer laser light (248.4 nm) or the like as exposure energy source, and a fine pattern forming process using such a resist composition.

With a recent trend toward high-density integration of semiconductor devices, there has been rising call for shortening of wavelength of the energy source of exposure means used for fine working, particularly photolithography, and now use of KrF excimer laser light (248.4 nm) and deep ultraviolet light is seriously considered. Various chemically amplified resist materials usable for light source in said chemical working have been reported. When producing high-density integrated circuits by using such a light source, a fine pattern is formed on the substrate by using a chemically amplified resist material. However, in the case of a highly reflective substrate made of such material as aluminum, polysilicon, aluminum-silicon, tungsten silicide or the like, when an ordinary chemically amplified resist material is used, sensitization could be induced in the unnecessary region due to reflection of light on the substrate surface or a side of a level difference, giving rise to the problems such as notching and halation. These problems become more serious in case of using deep ultraviolet light (300 nm or less in wavelength) or KrF excimer laser light (248.4 nm) which are shorter in wavelength than the conventional g-line (436 nm) or i-line (365 nm).

As a solution to these problems, it has been suggested to add a light absorber or a bleaching agent as in the resists for g-line or i-line, but addition of a light absorber tends to cause a drop of light transmittance, resulting in a lowered resolving performance. Also, when a bleaching agent, such as one having a diazodiketo group [—COC(=N₂)CO—] or a diazoketo group [—COC(=N₂)—] in the molecule is used, sensitivity of the resist lowers excessively. Thus, use of such light absorber or bleaching agent in the resist compositions is impractical.

EPC Patent No. 543,762 discloses use of phenoxymethylanthracene, anthracenemethanol, 9-10-diphenylanthracene, etc., as deep ultraviolet absorber. These anthracene derivatives, however, have poor solubility in resist solvents, and even if dissolved, they would be precipitated during storage to cause formation of particles, so that these substances are unsuited for use as a deep ultraviolet absorber for resist compositions. Thus, the appearance of a practical chemically amplified positive (or negative) resist composition capable of preventing occurrence of the undesirable phenomena such as halation in the short wavelength region has been looked forward.

SUMMARY OF THE INVENTION

The present invention has been made in view of the above circumstances, and it has for its object to provide a resist composition capable of inhibiting occurrence of the undesirable phenomena such as halation and notching while maintaining high resolving performance and high sensitivity of the composition when forming a fine pattern on a highly reflective substrate having level differences, which is made of such material as aluminum, polysilicon, aluminum-silicon, tungsten silicide or the like, by using deep ultraviolet light or KrF excimer laser light as exposure energy source, and a fine pattern forming process using such a resist composition.

The present invention provides a resist composition for deep ultraviolet light comprising:

(a) one of the following substances (i)–(iii):
  (i) a resin which becomes alkali-soluble on elimination of protective groups by the action of an acid;
  (ii) a combination of an alkali-soluble resin and a compound which becomes alkali-soluble on elimination of protective groups by the action of an acid; and
  (iii) a combination of an alkali-soluble resin and a compound which is crosslinked with the resin by the action of an acid to make the resin hardly soluble in an alkaline solution;

(b) a photosensitive compound which generates an acid on exposure to light;

(c) an anthracene derivative represented by the formula:

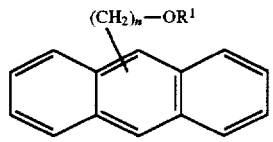
[1]

wherein R¹ is an alkyl group having 1–6 carbon atoms, a group represented by the formula:

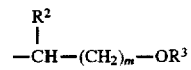
[2]

wherein R² is a hydrogen atom or an alkyl group having 1–4 carbon atoms, R³ is an alkyl group having 1–6 carbon atoms, and m is an integer of 0–3; or a group represented by the formula:

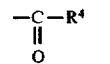
[3]

wherein R⁴ is an alkyl group having 1–6 carbon atoms, a phenyl group or a substituted phenyl group; and n is an integer of 1–5; and (d) a solvent.

The present invention also provides a process for forming a fine pattern comprising the steps of:
  (i) coating the resist composition described above on a semiconductor substrate and heating the formed resist film;
  (ii) exposing the resist film to deep ultraviolet light or KrF excimer laser light through a mask, if necessary, followed by heat treatment; and
  (iii) developing the film with an alkaline developing solution.

BRIEF DESCRIPTION OF THE DRAWINGS

FIGS. 1A–1C are the sectional views illustrating the process for forming a positive pattern on a highly reflective substrate by using a resist composition according to the present invention.

FIG. 2 is a sectional view showing defective pattern formation observed in an attempt to from a positive pattern on a highly reflective substrate by using a resist composition prepared in a Comparative Example.

DESCRIPTION OF THE PREFERRED EMBODIMENTS

Extensive studies by the present inventors for attaining said object have led to the finding that a chemically amplified resist composition containing a compound represented by the formula:

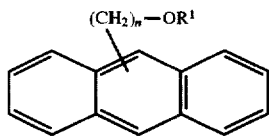

as a deep ultraviolet absorber for preventing halation and notching can realize said object. The present invention has been attained on the basis of this finding.

In the above formula [1], $R^1$ represents an alkyl group having 1–6 carbon atoms, a group represented by the formula [2] or a group represented by the formula [3]:

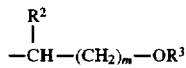

The alkyl group having 1–6 carbon atoms, represented by $R^1$ in the formula [1], includes methyl, ethyl, propyl, butyl, amyl and hexyl. (These groups may be straight-stain, branched or cyclic in molecular structure).

In the formula [2], $R^2$ represents a hydrogen atom or an alkyl group having 1–4 carbon atoms, and $R^3$ represents an alkyl group having 1–6 carbon atoms. The alkyl group having 1–4 carbon atoms, represented by $R^2$, includes methyl, ethyl, propyl and butyl (which may be straight-chain, branched or cyclic), and the alkyl group having 1–6 carbon atoms, represented by $R^3$, includes methyl, ethyl, propyl, butyl, amyl and hexyl (which may be straight-chain, branched or cyclic).

In the formula [3], $R^4$ represents an alkyl group having 1–6 carbon atoms, a phenyl group or a substituted phenyl group. The alkyl group having 1–6 carbon atoms, represented by $R^4$, includes methyl, ethyl, propyl, butyl, amyl and hexyl (which may be straight-chain, branched or cyclic). The substituent of the substituted phenyl group may be, for instance, one or more alkyl groups having 1–4 carbon atoms, alkoxyl groups having 1–4 carbon atoms or halogen atoms.

The resin which is made alkali-soluble on elimination of protective groups by the action of an acid may be a polymer represented by the formula:

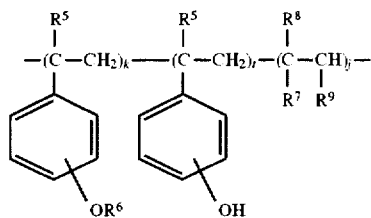

wherein $R^5$ and $R^8$ represent independently a hydrogen atom or a methyl group; $R^6$ represents a tert-butoxy-carbonyl group, tert-butyl group, tert-butoxycarbonyl-methyl group, 1-methylcyclohexyloxycarbonylmethyl group, tetrahydropyranyl group, 2-vinyloxyethyl group, vinyloxymethyl group, acetyl group or a group represented by the formula:

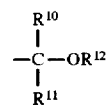

wherein $R^{10}$ represents a hydrogen atom or a methyl group; $R^{11}$ represents a straight-chain or branched alkyl group having 1–3 carbon atoms; and $R^{12}$ represents a straight-chain, branched or cyclic alkyl group having 1–6 carbon atoms; $R^7$ represents a hydrogen atom, a cyano group or a group represented by the formula:

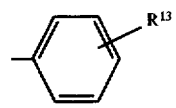

wherein $R^{13}$ represents a hydrogen atom, a halogen atom, a straight-chain or branched alkyl group having 1–6 carbon atoms, a straight-chain or branched alkoxyl group having 1–6 carbon atoms, tert-butoxy carbonyloxy group or an acetyloxy group; $R^9$ represents a hydrogen atom, a cyano group or—COOY (wherein Y is a straight-chain or branched alkyl group having 1–6 carbon atoms); k and t are each an integer of 1 or more; and j is 0 or an integer of 1 or more, provided that $0.2<(k+j)/(k+t+j)<0.8$, and when j is an integer of 1 or more, $0.05 \leq j/(k+t+j) \leq 0.50$.

Listed below are examples of these polymers:
poly(p-tert-butoxystyrene/p-hydroxystyrene),
poly(p-tert-butoxycarbonyloxystyrene/p-hydroxystyrene),
poly(p-tetrahydropyranyloxystyrene/p-hydroxystyrene),
poly(1-methoxy-1-methylethoxystyrene/p-hydroxystyrene),
poly(p-1-ethoxyethoxystyrene/p-hydroxystyrene),
poly(p-1-methoxyethoxystyrene/p-hydroxystyrene),
poly(p-1-n-butoxyethoxystyrene/p-hydroxystyrene),
poly(p-1-isopropoxyethoxystyrene/p-hydroxystyrene),
poly(p-1-ethoxyethoxystyrene/p-hydroxystyrene/p-acetyloxystyrene),
poly[p-1-(1,1-dimethylethoxy)-1-methylethoxystyrene/p-hydroxystyrene],
poly(p-tert-butoxystyrene/p-hydroxystyrene/methyl methacrylate),
poly(p-1-ethoxyethoxystyrene/p-hydroxystyrene/fumaronitrile),
poly(p-1-ethoxyethoxystyrene/p-hydroxystyrene/tert-butyl methacrylate),
poly(p-1-ethoxyethoxystyrene/p-hydroxystyrene/p-methylstyrene),
poly(p-1-methoxyethoxystyrene/p-hydroxystyrene/p-tert-butoxystyrene),
poly(p-1-ethoxyethoxystyrene/p-hydroxystyrene/p-tert-butoxycarbonyloxystyrene), poly(p-1-methoxyethoxystyrene/p-hydroxystyrene/p-methylstyrene),
poly|p-(2-vinyloxyethoxy)styrene-hydroxystyrene|,
poly(p-vinyloxymethoxystyrene/p-hydroxystyrene),
poly(p-1-ethoxyethoxystyrene/p-hydroxystyrene/styrene),
poly(p-1-ethoxyethoxystyrene/p-hydroxystyrene/p-tert-butoxystyrene),
poly(p-1-ethoxyethoxystyrene/p-hydroxystyrene/styrene),
poly(1-methylcyclohexyl p-vinylphenoxyacetate/p-hydroxystyrene),
poly(tert-butyl p-vinylphenoxyacetate/p-hydroxystyrene), and
poly(tert-butyl p-vinylphenoxy acetate/p-hydroxy-styrene/methyl methacrylate).

Of the polymers represented by the formula |4|, those of the formula in which $R^5$, $R^8$ and $R^9$ are each a hydrogen atom, $R^6$ is a group represented by the formula |5| (wherein $R^{10}$, $R^{11}$ and $R^{12}$ are as defined above) and $R^7$ is a group represented by the formula |6| (wherein $R^{13}$ is as defined above) are preferred.

Examples of such preferred polymers are:
poly(1-methoxy-1-methylethoxystyrene/p-hydroxystyrene),
poly(p-1-ethoxyethoxystyrene/p-hydroxystyrene),
poly(p-1-methoxyethoxystyrene/p-hydroxystyrene),
poly(p-1-n-butoxyethoxystyrene/p-hydroxystyrene),
poly(p-1-isopropoxyethoxystyrene/p-hydroxystyrene),
poly(p-1-ethoxyethoxystyrene/p-hydroxystyrene/p-acetyloxystyrene),
poly|p-1-(1,1-dimethylethoxy)-1-methylethoxystyrene/p-hydroxystyrene|,
poly(p-1-ethoxyethoxystyrene/p-hydroxystyrene/p-methylstyrene),
poly(p-1-methoxyethoxystyrene/p-hydroxystyrene/p-tert-butoxystyrene),
poly(p-1-methoxyethoxystyrene/p-hydroxystyrene/p-methylstyrene),
poly(p-1-methoxyethoxystyrene/p-hydroxystyrene/styrene),
poly(p-1-ethoxyethoxystyrene/p-hydroxystyrene/p-tert-butoxystyrene),
poly(p-1-ethoxyethoxystyrene/p-hydroxystyrene/p-tert-butoxycarbonyloxystyrene),
poly(p-1-ethoxyethoxystyrene/p-hydroxystyrene/styrene),
poly(1-methylcyclohexyl p-vinylphenoxyacetate/p-hydroxystyrene), and poly(tert-butyl p-vinylphenoxyacetate/p-hydroxystyrene).

As the alkali-soluble resin in the component (ii) or (iii), there can be used, for example, the polymers represented by the following formula of recurring unit:

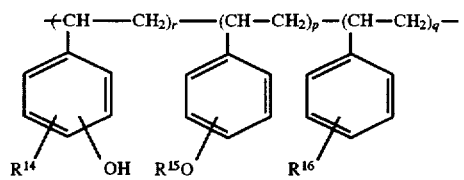

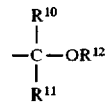

wherein $R^{14}$ is a hydrogen atom or a methyl group; $R^{15}$ is a tert-butoxycarbonyl group, tert-butoxycarbonylmethyl group, tert-butyl group, tetrahydropyranyl group, acetyl group or a group represented by the formula:

$$\begin{array}{c} R^{10} \\ | \\ -C-OR^{12} \\ | \\ R^{11} \end{array} \quad |5|$$

wherein $R^{10}$, $R^{11}$ and $R^{12}$ are as defined above; $R^{16}$ is a hydrogen atom, a halogen atom or a straight-chain or branched alkyl group having 1–6 carbon atoms; r is an integer of 1 or more; and p and q are independently 0 or an integer of 1 or more, provided that $0 \leq (p+q)/(r+p+q) \leq 0.2$.

Examples of such polymers are:
poly(p-hydroxystyrene),
poly(m-hydroxystyrene),
poly(m-methyl-p-hydroxystyrene),
poly(m-methyl-p-hydroxystyrene/p-hydroxystyrene),
poly(p-tert-butoxystyrene/p-hydroxystyrene) |wherein the ratio of p-tert-butoxystyrene unit to p-hydroxystyrene unit is defined to be 2↓:8↑|,
poly(p-1-ethoxyethoxystyrene/p-hydroxystyrene) |wherein the ratio of p-1-ethoxyethoxy-styrene unit to p-hydroxy-styrene unit is defined to be 2↓:8↑|,
poly(tert-butyl/p-vinylphenoxyacetate/p-hydroxystyrene), |wherein the ratio of tert-butyl p-vinylphenoxyacetate unit to p-hydroxystyrene unit is defined to be 2↓:8↑|,
poly(p-1-ethoxyethoxystyrene/p-tert-butoxystyrene/p-hydroxystyrene) |wherein the ratio of p-1-ethoxyethoxy-styrene unit and p-tert-butoxystyrene unit to p-hydroxystyrene unit is defined to be 2↓:8↑|, and
poly(p-tert-butoxystyrene/styrene/p-hydroxystyrene) |wherein the ratio of p-tert-butoxystyrene unit and styrene unit to p-hydroxystyrene unit is defined to be, 2↓:8↑|.

Of the polymers represented by the formula |7|, those of the formula wherein $R^{14}$ is a hydrogen atom, and $R^{15}$ is tert-butyl group, acetyl group or a group represented by the formula [5] (wherein $R^{10}$, $R^{11}$ and $R^{12}$ are as defined above) are especially preferred.

Examples of such preferred polymers are:
poly(p-hydroxystyrene), poly(p-tert-butoxystyrene/p-hydroxystyrene) |wherein the ratio of p-tert-butoxystyrene unit to p-hydroxy-styrene unit is defined to be 2↓:8↑|,
poly (p-1-ethoxyethoxystyrene/p-hydroxy-styrene) |wherein the ratio of p-1-ethoxyethoxystyrene unit to p-hydroxy-styrene unit is defined to be 2↓:8↑|, and
poly(p-tert-butoxystyrene/styrene/p-hydroxystyrene) [wherein the ratio of p-tert-butoxystyrene unit and styrene unit to p-hydroxystyrene unit is defined to be 2↓:8↑|.

As the compound which becomes alkali-soluble on elimination of protective groups by the action of an acid (this compound being hereinafter referred to as "dissolution inhibiting compound"), there can be used the compounds represented by the following formula [8]:

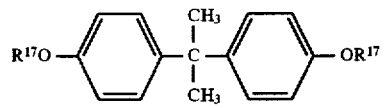

wherein $R^{17}$ is a tert-butoxycarbonyl group, tert-butyl group, tetrahydropyranyl group, tert-butoxycarbonyl-methyl group, 1-methylcyclohexyloxycarbonylmethyl group or a group represented by the formula:

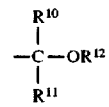

wherein $R^{10}$, $R^{11}$ and $R^{12}$ are as defined above, the compounds represented by the following formula:

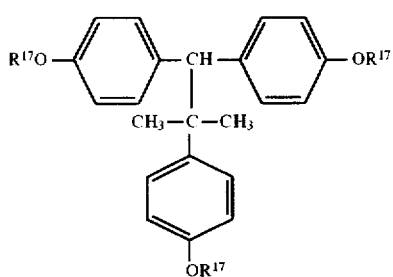

|9| wherein $R^{17}$ is as defined above, and various acetal compounds.

Examples of such dissolution-inhibiting compounds are:
2,2-bis(4-tert-butoxyphenyl)propane,
2,2-bis(tetrahydropyranyloxyphenyl)propane,
2,2-bis|4-(1-ethoxyethoxy)phenyl|propane,
2,2-bis|4-(1-methoxyethoxy)phenyl|propane,
2,2-bis|4-(1,1-dimethylethoxy)phenyl|propane,
2,2-bis|4-(1-ethoxyethoxycarbonylmethoxy)phenyl|-propane,
2,2-bis(4-tert-butoxycarbonyloxyphenyl )propane,
2,2-bis(tert-butoxycarbonylmethoxyphenyl)propane,
1,1,2-tris(4-tert-butoxyphenyl)-2-methylpropane,
1,1,2-tris|4-(1-ethoxyethoxy)phenyl|-2-methylpropane,
1,1,2-tris(4-tert-butoxycarbonylmethoxyphenyl)-2-methyl propane,
1,1,2-tris(tert-butoxycarbonyloxyphenyl)-2-methylpropane,
1,1,2-tris(1-benzyloxyethoxyphenyl)-2-methylpropane,
substituted or non-substituted benzaldehydeacetal,
substituted or non-substituted benzaldehyde N,O-acetal,
acetaldehydeacetal, acetaldehyde N,O-acetal,
propionaldehydeacetal, propionaldehyde N,O-acetal,
butylaldehydeacetal, and butylaldehyde N,O-acetal.

As the compound which is crosslinked with the resin by the action of an acid to make the resin hardly soluble in alkalis in the component (iii) (such a compound being hereinafter referred to as "cross-linkable compound"), there can be used the compounds represented by the following formula:

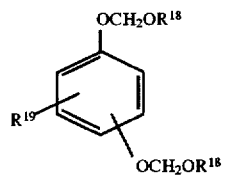

|10| wherein $R^{18}$ is a straight-chain, branched or cyclic alkyl group having 1–6 carbon atoms; $R^{19}$ is a hydrogen atom or a group represented by the formula:

  —$OCH_2OR^{18}$

|11| wherein $R^{18}$ is as defined above and the compounds represented by the following formula:

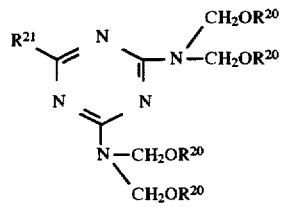

|12| wherein $R^{20}$ is a hydrogen atom or a straight-chain, branched or cyclic alkyl group having 1–6 carbon atoms;

and $R^{21}$ is a hydrogen atom or a group represented by the formula:

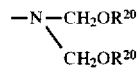

|13| wherein $R^{20}$ is as defined above.

Examples of these crosslinkable compounds are:

1,2,4-tris(cyclohexyloxymethoxy)benzene,
1,2,4-tris(isobutoxymethoxy)benzene,
1,2,4-tris(isopropoxymethoxy)benzene,
1,3,5-tris(cyclohexyloxymethoxy)benzene,
1,3,5-tris(isobutoxymethoxy)benzene,
1,3,5-tris(isopropoxy)benzene,
1,3-bis(cyclohexyloxymethoxy)benzene,
1,3-bis(isobutoxymethoxy)benzene,
1,3-bis(isopropoxymethoxy)benzene,
1,4-bis(cyclohexyloxymethoxy)benzene,
1,4-bis(isobutoxymethoxy)benzene,
1,4-bis(isopropoxymethoxy)benzene,
2,4,6-tris(N,N-dimethoxymethylamino-1,3,5-triazine, and
2,4-bis(N,N-dimethoxymethylamino)-1,3,5-triazine.

As the photosensitive compound (b) which generates an acid on exposure to light (hereinafter referred to as "acid generater"), any of the photo-senstive compounds capable of generating an acid on exposure to light and giving no adverse effect on resist pattern formation can be used, but the compounds represented by the following formulae |14|, |15|, |16|, |17| and |18| are preferably used in the present invention:

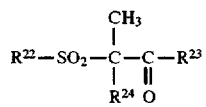

|14| wherein $R^{22}$ and $R^{23}$ are independently a straight-chain, branched or cyclic alkyl group having 1–6 carbon atoms, a phenyl group or a substituted phenyl group; and $R^{24}$ is a straight-chain or branched alkyl group having 1–3 carbon atoms;

|15| wherein $R^{25}$ and $R^{26}$ are independently a straight-chain, branched or cyclic alkyl group having 1–6 carbon atoms, a phenyl group or a substituted phenyl group;

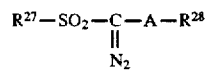

|16| wherein $R^{27}$ and $R^{28}$ are independently a straight-chain, branched or cyclic alkyl group having 1–10 carbon atoms, a phenyl group or a substituted phenyl group; and A is a sulfonyl group or a carbonyl group;

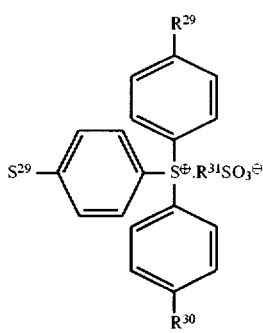

[17]

wherein $R^{29}$ and $R^{30}$ are independently a hydrogen atom, a halogen atom or a straight-chain or branched alkyl group having 1–4 carbon atoms; $R^{31}$ is a perfluoroalkyl group having 1–8 carbon atoms;

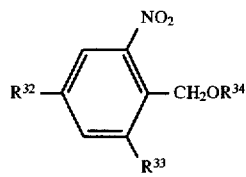

[18]

wherein $R^{32}$ and $R^{33}$ are independently a hydrogen atom, a halogen atom or a nitro group; and $R^{34}$ is a trichloro-acetyl group, a p-tosyl group, a p-trifluoromethyl-benzenesulfonyl group, a methanesulfonyl group or a trifluoromethanesulfonyl group.

Examples of these acid generaters usable in the present invention are:
2-methanesulfonyl-2-methyl-(4-methylthio)propiophenone,
2-methyl-2-(p-toluenesulfonyl)propiophenone,
2,4-dimethyl-2-(p-toluenesulfonyl)pentane-3-one,
2-cyclohexylcarbonyl-2-(p-toluenesulfonyl)propane,
diphenyldisulfone,
di(p-tolyl)disulfone,
dicyclohexyldisulfone,
bis(p-toluenesulfonyl)diazomethane,
methylsulfonyl p-toluenesulfonyldiazomethane,
bis(2,4-dimethylbenzenesulfonyl)diazomethane,
bis(p-chlorobenzenesulfonyl)diazomethane,
bis(p-tert-butylbenzenesulfonyl)diazomethane,
bisbenzenesulfonyldiazomethane,
triphenylsulfonium trifluoromethanesulfonate,
diphenyl-p-tolylsulfonium perfluorooctanesulfonate,
di(p-chlorophenyl)-p-tolylsulfonium trifluoromethanesulfonate,
biscyclohexylsulfonyldiazomethane,
bis(tert-butylsulfonyl)diazomethane,
p-toluenesulfonyl-cyclohexylsulfonyldiazomethane,
p-toluenesulfonyl-cyclohexylcarbonyldiazomethane,
2-nitrobenzyl p-toluenesulfonate,
2,6-dinitrobenzyl p-toluenesulfonate,
2,4-dinitrobenzyl p-trifluoromethylbenzenesulfonate.

The resins (i) which become alkali-soluble on elimination of protective groups by the action of an acid can be easily obtained by the known methods such as disclosed in Japanese Patent Application Kokai (Laid-Open) (JP-A) No. 4-211258 (U.S. Pat. No. 5,350,660) and JP-A-4-251259 (EPC Patent No. 476,865).

The alkali-soluble resins usable in the components (ii) and (iii) and the crosslinkable compounds usable in (iii) can be easily obtained by, for example, the method shown in EPC Patent No. 579,420.

The compounds which become alkali-soluble on elimination of protective groups by the action of an acid usable in the component (ii) can be easily obtained by, for example, the method disclosed in JP-A-4-88348.

The acid generaters (b) can be easily obtained by the methods such as disclosed in JP-A-4-211258 (U.S. Pat. No. 5,350,660), JP-A-4-251259 (EPC Patent No. 476,865) and JP-A-4-210960 (U.S. Pat. No. 5,216,135).

As for the solvent (d), it is possible to use any solvent which is capable of dissolving the substance (i), (ii) or (iii), the acid generater and the compound of the formula |1| used in the preparation of the composition of the present invention, but usually a solvent having good film forming properties is preferably used. Examples of such solvents include methyl cellosolve acetate, ethyl cellosolveacetate, propylene glycol monomethylether acetate, propyleneglycol monoethylether acetate, methyl lactate, ethyl lactate, 2-ethoxyethyl acetate, methyl pyruvate, ethyl pyruvate, methyl 3-methoxypropionate, ethyl 3-methoxy-propionate, ethyl 3-ethoxypropionate, N-methyl-2-pyrrolidone, cyclohexanone, methyl ethyl ketone, 2-heptanone, 1,4-dioxane, diethylene glycol monomethyl ether, diethylene glycol dimethyl ether and ethylene glycol isopropyl ether.

Examples of the compounds of the formula |1| usable as deep ultraviolet absorber (c) in the present invention include:
9-(2-tert-butoxyethoxy)methylanthracene,
9-(2-n-butoxyethoxy)methylanthracene,
9-(2-isobutoxyethoxy)methylanthracene,
9-(2-isopropoxyethoxy)methylanthracene,
9-(2-ethoxyethoxy)methylanthracene,
9-(2-methoxyethoxy)methylanthracene,
9-(3-methoxybutoxy)methylanthracene,
9-(1-methoxymethylpropoxy)methylanthracene,
9-(1-methoxymethylethoxy)methylanthracene,
2-(2-ethoxyethoxy)methylanthracene,
2-(2-methoxyethoxy)methylanthracene,
9-{3-(2-ethoxyethoxy)propyl}anthracene,
9-{3-(2-methoxyethoxy)propyl}anthracene,
9-methoxymethylanthracene,
9-ethoxymethylanthracene,
9-isopropoxymethylanthracene,
9-methoxymethoxymethylanthracene,
9-anthrylmethyl acetate,
9-anthrylmethyl propionate,
9-anthrylmethyl p-methylbenzoate,
9-anthrylmethyl benzoate, and
9-anthrylpropyl acetate.

The compounds of the formula |1| usable as deep ultraviolet absorber in the present invention can be easily synthesized according to, for example, the following processes A–C:

Process A:
One mole of a compound represented by the following formula:

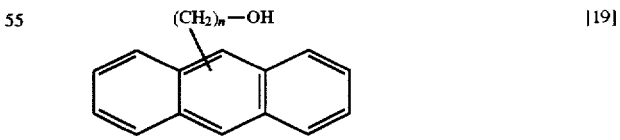

[19]

wherein n is as defined above, and 0.5-100 moles of a compound represented by the following formula:

HO—R¹     [20]

wherein $R^1$ is as defined above, are reacted with stirring in an organic solvent such as benzene, toluene, cyclohexane or the like or without solvent in the presence of an acid such as sulfuric acid, nitric acid, hydrochloric acid, phosphoric acid, p-toluene-sulfonic acid or the like at 20°–150° C., preferably 50°–130° C., for 0.5–10hours, and the reaction product is subjected to appropriate after-treatments according to known methods.

Process B:

One mole of a compound of the formula |19| and 1–10 moles of a halogenating agent (such as thionyl chloride, phosphorus oxychloride, phosphorus trichloride, phosphorus pentachloride, sulfuryl chloride, hydrogen chloride, hydrochloric acid, phosphorus oxybromide, phosphorus tribromide, phosphorus pentabromide, hydrogen bromide, hydrobromic acid, hydrogen iodide or the like) are reacted with stirring in a suitable solvent (such as methylene chloride, benzene, toluene, n-hexane or the like) at 20°–150° C. for 0.5–10 hours to give an alkyl chloride compound represented by the formula:

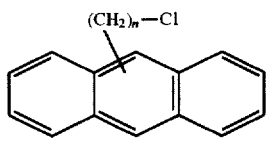

|21| wherein n is as defined above.

Then one mole of this alkyl chloride compound and 0.5–100 moles of a compound of the formula |20| are reacted with stirring in an appropriate solvent (such as methylene chloride, benzene, toluene, n-hexane, xylene, tetrahydrofuran or the like) without catalyst or in the presence of a base (such as sodium hydroxide, potassium hydroxide, potassium tert-butoxide, sodium, potassium, sodium methoxide, sodium ethoxide, sodium hydride or the like) at 20°–150° C. for 0.5–20 hours, and the reaction product is subjected to pertinent aftertreatments in the usual way.

Process C:

One mole of a compound of the formula |20| and 1–10 moles of a halogenating agent (such as thionyl chloride, phosphorus oxychloride, phosphorus trichloride, phosphorus pentachloride, sulfuryl chloride, hydrogen chloride, hydrochloric acid, phosphorus oxybromide, phosphorus tribromide, phosphorus pentabromide, hydrogen bromide, hydrobromic acid, hydrogen iodide or the like) are reacted with stirring in a proper solvent (such as methylene chloride, benzene, toluene, n-hexane or the like) at 20°–150° C. for 0.5–10 hours, and the reaction product is subjected to pertinent after-treatments according to the conventional methods to give a compound represented by the following formula:

 |22| wherein X is a halogen atom and $R^1$ is as defined above.

Then one mole of this compound and 1–20 moles of a compound of the formula |19| are reacted with stirring in a suitable solvent (such as methylene chloride, benzene, toluene, xylene, tetrahydrofuran, 1,4-dioxane or the like) in the presence of a base (such as sodium hydroxide, potassium hydroxide, sodium hydride, sodium methoxide, sodium ethoxide, potassium tert-butoxide, triethylamine, diethylamine, pyridine, piperidine or the like) at 20°–150° C. for 0.5–10 hours, and the reaction solution is subjected to necessary after-treatments in the usual way.

The resist composition of the present invention is essentially composed of said four components ((a) a resin which becomes alkali-soluble by the action of an acid, (b) acid generater, (c) deep ultraviolet absorber and (d) solvent) or five components (alkali-soluble resin, dissolution-inhibiting compound, acid generater, deep ultraviolet absorber and solvent, or alkali-soluble resin, crosslinkable compound, acid generater, deep ultraviolet absorber and solvent), but if necessary it is possible to add one or more of adjunct substances which include sensitivity adjustor (for example, basic resins such as polyvinyl-pyridine, poly(vinylpyridine/methyl methacrylate), poly(vinylpyridine/p-methylstyrene), etc., and organic basic compounds such as pyridine, piperidine, triethylamine, diethylamine, tetramethylammonium hydroxide, etc.), plasticizer (such as diethyl phthalate, dibutyl phthalate, dipropyl phthalate, etc.), and surfactant (such as nonionic or fluorine-containing nonionic surfactants).

In the resist composition of the present invention, the ratio of the acid generater (b) to the resin (i) which becomes alkali-soluble on elimination of protective groups by the action of an acid is usually about 1–30 to 100, preferably about 1–20 to 100, in parts by weight.

Further, in the resist composition of the present invention, the dissolution inhibiting compound is usually contained in an amount of 10 to 50 parts by weight, preferably 15 to 40 parts by weight, per 100 parts by weight of the alkali-soluble resin. In addition, the acid generator is usually contained in an amount of 1 to 30 parts by weight, preferably 1 to 20 parts by weight, per 100 parts by weight of a total of the alkali-soluble resin and the dissolution inhibiting compound.

The ratio of the crosslinkable compound to the alkali-soluble resin in the component (iii) is usually about 10–50 to 100, preferably about 15–40 to 100, in parts by weight.

The ratio of the acid generater to the sum of the alkali-soluble resin and the crosslinkable compound is usually about 1–30 to 100, preferably about 1–20 to 100, in parts by weight.

The amount of the solvent in the resist composition of the present invention is not specifically restricted as far as it does not disturb substrate coating with the resist composition obtained by dissolving in said solvent a composition prepared by adding one or more of the deep ultraviolet absorbers (compounds of the formula |1|) according to the present invention to any of said three base compositions |(i)+acid generater, (ii)+acid generater, and (iii)+acid generater|. Usually, however, the solvent is added in an amount of about 100–2,000 parts by weight, preferably about 150–600 parts by weight, to 100 parts by weight of the resin which becomes alkali-soluble on elimination of protective groups by the action of an acid, or to 100 parts by weight of the sum of the alkali-soluble resin and the dissolution inhibiting compound or the sum of the alkali-soluble resin and the crosslinkable compound.

The amount of the deep ultraviolet absorber used in the composition of the present invention is 0.05–20% by weight, preferably 0.1–10% by weight, based on the resin in the composition.

As the developing solution for pattern formation, an alkali solution of a suitable concentration that will allow enlargement of the difference in dissolving rate between the exposed portion and the non-exposed portion is used. The concentration is usually selected from the range of 0.01–20% according to the solubility of the resist composition. As the alkali solution used in this invention, the solutions containing organic amines such as tetramethylammonium hydroxide (TMAH), choline, triethanolamine, etc., or inorganic alkalis such as NaOH, KOH, etc., are suited. The resist composition of this invention is most preferably developed with an aqueous TMAH solution.

Pattern formation by use of a resist composition of the present invention can be accomplished in the following way.

A resist composition containing a deep ultraviolet absorber according to the present invention is coated on a highly reflective substrate such as an aluminum substrate to a coating thickness of about 0.5–2 μm (about 0.1–0.5 μm in case the composition is used for forming the top layer of a three-layer coat) and prebaked in an oven at 70°–130° C. for 10–30 minutes or on a hot plate at 70°–130° C. for 1–2 minutes. The thus formed resist film is covered with a mask for forming a desired pattern, exposed to deep ultraviolet light with a wavelength of 300 nm or less or KrF excimer laser light (248.4 nm) at an intensity of about 1–100 mJ/cm$^2$ and, if necessary, baked on a hot plate at 70°–150° C. for 1–2 minutes. The resulting resist film is then developed with a suitable developing solution such as a 0.1–5% aqueous TMAH solution for about 0.5–3 minutes according to a conventional method such as dipping, puddling or spraying. Consequently, a desired positive or negative pattern is formed with good shape on the substrate.

When deep ultraviolet light is applied to the resist film formed by coating a resist composition of this invention on a highly reflective substrate made of such material as aluminum, polysilicon, aluminumsilicon, tungsten silicide or the like, the reflected light from the substrate is weakened remarkably in the exposed region since deep ultraviolet light is absorbed when passing through the resist film. Consequently, light interference in the resist film is lessened. Also, reflected light to the non-exposed region is readily absorbed. Therefore, the influence of halation or standing wave is reduced.

Further, since deep ultraviolet light penetrates down to the bottom layer of the resist film in the exposed region, an acid is generated from the acid generator and chemical amplification advances sufficiently, so that no reduction of resolving performance is caused.

Also, as compared with the conventional photosensitive compounds having diazoketo group, diazodiketo group, diazodisulfonyl group, diazoketosulfonyl group or like groups in the molecule, which are supposed to suffer a drop of absorbance on irradiation with deep ultraviolet light, the deep ultraviolet absorber used in the resist composition according to the present invention is advantageous in that it is perfectly free of the defects of said conventional compounds, such as liability to suffer a large drop of sensitivity, necessity of being added in a large amount because of low light absorptivity at around 250 nm, and consequent possibility of causing improper pattern formation and poor resolving performance. Thus, the deep ultraviolet absorber used in this invention contributes to enabling formation of a desired pattern even on a highly reflective substrate having level differences, which has been unattainable by use of the conventional photosensitive compounds.

It is also remarkable that the deep ultraviolet absorber used in the resist composition according to the present invention, owing to its excellent solvent solubility, won't be precipitated unlike the conventional anthracene derivatives, even when the resist composition is stored for a long time, and has enabled obtainment of a practical resist composition for highly reflective substrates.

The present invention is described in further detail hereinbelow with reference to the synthesis, embodiment and comparative examples, but the present invention is not subject to any restrictions by these examples.

Synthesis Examples 1 Synthesis of 9-(2-methoxyethoxy)methylanthracene

To a solution of 2-methoxyethanol (1 l) in benzene (1.5 l), conc. sulfuric acid (3 ml) was added and the mixture was heated to 80° C. A solution of 9-anthracenemethanol (45 g, 0.22 mole) in 2-methoxyethanol (450 ml) was added to the mixture under reflux and stirring was continued for 1.5 hours under reflux. After standing at room temperature overnight, the reaction mixture was washed with saturated aqueous sodium bicarbonate, dried over anhydrous MgSO$_4$ and evaporated. The residual crude oil (63 g) was chromatographed on silica gel (Wakogel C-200, manufactured by Wako Pure Chemical Industries, Ltd.) with n-hexane/ethyl acetate |50/1→25/1→8/1(V/V)| as eluent to give 47.6 g of 9-(2-methoxyethoxy)methylanthracene as orange yellow oil.

$^1$HNMR δppm (CDCl$_3$): 3.37 (3H, S, CH$_3$ O), 3.53–3.57 (2H, t, CH$_3$ O—CH$_2$—), 3.73–3.77 (2H, t, CH$_3$ O—CH$_2$ CH$_2$ O), 5.55 (2H, s, Ar—CH$_2$ O—), 7.43–7.56 (4H, m, Aromatic 2-H, 3-H, 6-H, 7-H), 7.99 (2H, d, J=9 Hz, Aromatic 4-H, 5-H), 8.42 (2H, d, J=9 Hz, Aromatic 1-H, 8-H), 8.44 (1H, s, Aromatic 10-H). IR (Neat) vcm$^{-1}$: 1130; UV (MeCN) ε(λ=248 nm): 8.85×10$^4$ Synthesis Example 2 Synthesis of 9-(2-ethoxyethoxy)methylanthracene (1) To a suspension of 9-anthracenemethanol (50 g, 0.24 mole) in methylene chloride (50 ml), a solution of thionyl chloride (32.3 g, 0.27 mole) in benzene (300 ml) was added, and reacted with stirring for 10 hours under reflux. The reaction mixture was poured into ice-water (500 ml). An organic layer separated was washed with H$_2$O (100 ml×3), dried over anhydrous MgSO$_4$ and evaporated to give 51.2 g of 9-chloromethylanthracene as residual crude orange yellow oil.

(2) Crude 9-chloromethylanthracene (5.2 g, 23 mmole) obtained in above (1) and 2-ethoxyethanol (300 ml) were reacted for 10 hours at room temperature. The reaction mixture was poured into water (300 ml), and extracted with methylene chloride (300 ml×1). The resulting organic layer was dried over anhydrous MgSO$_4$ and evaporated. The residual crude oil (2.75 g) was chromatographed on silica gel (Wakogel C-200) with n-hexane/ethyl acetate (10/1) as eluent to give 1.52 g of 9-(2-ethoxyethoxy)methylanthracene as orange yellow oil.

$^1$HNMR δppm (CDCl$_3$): 1.21–1.26 (3H, t, CH$_3$ CH$_2$O), 3.49–3.57 (2H, q, CH$_3$ CH$_2$ O), 3.59–3.63 (2H, t, —OCH$_2$ CH$_2$ O—CH$_2$ CH$_3$), 3.76–3.80 (2H, t, —OCH CH$_2$ —OCH$_2$ CH$_3$), 5.56 (2H, s, ArCH$_2$O—), 7.46–7.54 (4H, m, Aromatic 2-H, 3-H, 6-H, 7-H), 8.00 (2H, d, J=8 Hz, Aromatic 4-H, 5-H), 8.43 (2H, d, J=8 Hz, Aromatic 1-H, 8-H), 8.46 (1H, s, Aromatic 10-H).

UV (MeCN) ε(λ=248 rm): 8.34×10$^4$.

Synthesis Example 3 Synthesis of 9-ethoxymethylanthracene

A solution of 9-chloromethylanthracene (5.2 g, 23 mmole) obtained in Synthesis Example 2-(1) in ethanol (700 ml) was reacted with stirring for 10 hours at room temperature, poured into H$_2$O (700 ml), and extracted with methylene chloride (500 ml×1). The resulting organic layer was dried over anhydrous MgSO$_4$ and evaporated. The residual crude solid (4.25 g) was recrystallized from 50% THF/H$_2$O to give 4.02 g of 9-ethoxymethylanthracene as orange yellow crystals, mp. 74–75° C.

$^1$HNMR δppm (CDCl$_3$): 1.25–1.30 (3H, t, CH$_3$ CH$_2$ O—), 3.73–3.75 (2H, q, CH$_3$ CH$_2$ O—), 5.46 (2H, s, ArCH$_2$ O—), 7.45-7.54 (4H, m, Aromatic 2-H, 3-H, 6-H, 7-H), 8.00 (2H, d, J=9 Hz, Aromatic 4-H, 5-H), 8.39 (2H, d, J=9 Hz, Aromatic 1-H, 8-H), 8.44 (1H, s, Aromatic 10-H). IR (KBr-Disk) vcm$^1$: 1092. UV (MeCN) ε(λ=248 nm): 8.09×10$^4$.

Synthesis Example 4 Synthesis of 9-anthrylmethyl acetate

A solution of 9-anthracenemethanol (15.0 g, 72 mmole) and triethylamine (7.3 g, 72 mmole) in methylene chloride (100 ml) and 1,4-dioxane (120 ml) was cooled. Acetyl chloride (6.8 g, 86.4 mmole) was added dropwise to the solution at 5°–10° C. and reacted with stirring for 2.5 hours at same temperature. After reaction, the reaction mixture was poured into ice-cold H$_2$O (350 ml), acidified with 10% aqueous HCl, extracted with methylene chloride (100 ml). The resulting organic layer was washed with H$_2$O (100 ml×1), saturated aqueous sodium bicarbonate (100 ml×1) and H$_2$O (100 ml×1), dried over anhydrous MgSO$_4$ and evaporated. The residual crude solid (17.7 g) was recrystallized from n-hexane to give 11.0 g of 9-anthrylmethyl acetate as yellow needles having a melting point of 110.0°–111.5° C.

$_1$HNMR δppm (CDCl$_3$): 2.07 (3H, s, CH$_3$ COO—), 6.14 (2H, s, —COOCH—), 7.45–7.60 (4H, m, Aromatic 2-H, 3-H, 6-H, 7-H), 8.01 (2H, d, J=8 Hz, Aromatic 4-H, 5-H), 8.32 (2H, d, J=8 Hz, Aromatic 1-H, 8 -H), 8.49 (1H, s, Aromatic 10-H). IR (KBr-Disk) vcm$^1$: 1727. UV (MeCN) ε(λ=248 nm): 9.81×10$^4$.

Synthesis Example 5 Synthesis of 9-anthrylmethyl propionate

Using propanoyl chloride (7.4 g, 79 mmole) in place of acetyl chloride, the reaction and treatment were carried out in the same manner as described in Synthesis Example 4. The crude solid (17.2 g) was recrystallized from n-hexane to give 12.3 g of 9-anthrylmethyl propionate as yellow needles. mp. 79.0°–80.0° C.

$^1$HNMR δppm (CDCl$_3$): 1.11–1.17 (3H, t, CH$_3$ CH$_2$ COO—), 2.31–2.39 (2H, q, CH$_3$ CH$_2$), 6.16 (2H, s, —COOCH$_2$—), 7.46–7.60 (4H, m, Aromatic 2-H, 3-H, 6-H, 7-H), 8.02 (2H, d, J=8 Hz, Aromatic 4-H, 5-H), 8.33 (2H, d, J=8 Hz, Aromatic 1-H, 8-H), 8.50 (1H, s, Aromatic 10-H). IR (KBr-Disk) vcm$^1$: 1738. UV (MeCN) ε(λ=248 nm): 9.82×10$^4$ Synthesis Example 6 Synthesis of 9-anthrylmethyl p-methylbenzoate Using p-methylbenzoyl chloride (13.3 g, 86 mmole) in place of acetyl chloride, the reaction and treatment were carried out in the same manner as described in Synthesis Example 4. The crude solid (25.1 g) was recrystallized from n-hexane to give 8.8 g of 9-anthrylmethyl p-methylbenzoate as yellow needles having a melting point of 123.5°–124.5° C.

$^1$HNMR δppm (CDCl$_3$): 2.35 (3H, s, ArCH$_3$), 6.37 (2H, s, —COOCH—), 7.15 (2H, d, J=8 Hz, Phenyl ring 3-H, 5-H), 7.47–7.61 (4H, m, Anthracene ring 2-H, 3-H, 6-H, 7-H), 7.88 (2H, d, J=8 Hz, Phenyl ring 2-H, 6-H), 8.05 (2H, d, J=8 Hz, Anthracene ring 4-H, 5-H), 8.44 (2H, d, J=8 Hz, Anthracene ring 1-H, 8-H), 8.53 (1H, s, Anthracene ring 10-H). IR (KBr-Disk) vcm$^{-1}$: 1712. UV (MeCN) ε(λ=248 nm): 1.09×10$^5$.

Synthesis Example 7 Synthesis of poly[p-(1-ethoxy-ethoxy)styrene/p-hydroxystyrene]

(1) A solution of p-tert-butoxystyrene (17.6 g) in toluene containing catalytic amount of 2,2'-azobisisobutyronitrile was polymerized at 80° C. for 6 hours under nitrogen. After cooling, the reaction mixture was poured into methanol (1 l) and the polymer was precipitated. The polymer was filtered, washed with methanol and dried under reduced pressure to afford 16.8 g of poly(p-tert-butoxystyrene) as white powder having Mw 10000 (GPC with polystyrene calibration).

(2) A solution of poly(p-tert-butoxystyrene) (15.0 g) obtained in above (1) and conc. hydrochloric acid (10 ml) in 1,4-dioxane was refluxed for 4 hours with stirring. The mixture was cooled, poured into H$_2$O (1 l) and the solid was precipitated. The polymer was filtered, washed with H$_2$O and dried under reduced pressure to give 9.7 g of poly(p-hydroxystyrene) as white powder.

(3) To a solution of poly(p-hydroxystyrene) (4.0 g) obtained in above (2) and ethyl vinyl ether (1.2 g) in a mixed solvent (35 ml) of pyridine and 1,4-dioxane, a catalytic amount of p-toluenesulfonic acid was added and reacted with stirring at room temperature for 24 hours. The reaction mixture was poured into H$_2$O (1 l) and a white solid was precipitated. The polymer was filtered, washed with H$_2$O and dried under reduced pressure to afford 5.0 g of the desired product as white powder having Mw 10000 (GPC with polystyrene calibration). The polymer was found to have p-(1-ethoxyethoxy)styrene unit and p-hydroxystyrene unit in a molar ratio of ca. 4:6 based on $^1$HNMR.

Synthesis Example 8 Synthesis of poly{p-[2-(2-methoxy)propoxy]styrene/p-hydroxystyrene}

To a solution of poly(p-hydroxystyrene) (4.0 g) obtained in the same manner as described in Synthesis Example 7-(2) and 2-methoxy-1-propene (4.8 g) in a mixed solvent (35 ml) of 1,4-dioxane and pyridine, a catalytic amount of pyridinium sulfate was added and then reacted with stirring at room temperature for 20 hours. After reaction, the reaction mixture was poured into H$_2$O (1 l) and a white solid was precipitated. The polymer was filtered, washed with H$_2$O and dried under reduced pressure to afford 4.1 g of the desired product as white powder having Mw 10000 (GPC with polystyrene calibration). The polymer was found to have p-[2-(2-methoxy)propoxy]styrene unit and p-hydroxystyrene unit in a molar ratio of ca. 1:1 based on $^1$HNMR.

Synthesis Example 9 Synthesis of poly(p-tert-butoxycarbonyloxystyrene/p-hydroxystyrene)

(1) A solution of p-tert-butoxycarbonyloxystyrene (22 g) obtained by the method of USP 4,491,628 (1985) in toluene containing catalytic amount of 2,2'-azobis(2,4-dimethylvaleronitrile) was heated at 90° C. for 4 hours under nitrogen. After cooling, the reaction mixture was poured into methanol and polymer was precipitated. The polymer was filtered, washed with methanol and dried under reduced pressure to give 15.2 g of poly(p-tert-butoxycarbonyloxystyrene) as white powder having Mw 12000 (GPC with polystyrene calibration).

(2) To a solution of poly(p-tert-butoxycarbonyloxystyrene) (7.0 g) obtained in above (1) in 1,4-dioxane, conc. hydrochloric acid (5 ml) was added and continued to stir under reflux for 1.5 hours. After cooling, the reaction mixture was poured into H$_2$O (1 l) and the polymer was precipitated. The polymer was filtered by suction, washed with H$_2$O and dried in vacuo to afford 4.8 g of poly(p-tert-butoxycarbonyloxystyrene/p-hydroxystyrene) as white powder having Mw 9500 (GPC with polystyrene calibration). The composition of the polymer was found to be p-tert-butoxycarbonyloxystyrene unit and p-hydroxystyrene unit in a molar ratio of ca. 1:1 based on $^1$HNMR analysis.

Synthesis Example 10 Synthesis of poly(tert-butyl p-vinylphenoxyacetate/p-hydroxystyrene)

A suspension of poly(p-hydroxystyrene) (4.0 g) obtained in the same manner as described in Synthesis Example 7-(2), tert-butyl monochloroacetate (3.0 g) and anhydrous K$_2$CO$_3$ (2.8 g) in acetone (35 ml) was reacted with stirring for 2 hours under reflux. After cooling, the precipitate was filtered off, the filtrate was poured into H$_2$O (1 l) and was precipitated. The precipitate was filtered, washed with H$_2$O and dried under reduced pressure to give 5.2 g of poly(tert-butyl p-vinylphenoxyacetate/p-hydroxystyrene) as white powder having Mw 11000 (GPC with polystyrene calibration). The polymer was found to have tert-butyl p-vinylphenoxyacetate unit and p-hydroxystyrene unit in a molar ratio of ca. 1:1 based on $^1$HNMR.

Synthesis Example 11 Synthesis of poly[p-(1-ethoxyethoxy) styrene/p-hydroxystyrene/p-tert-butoxystyrene]

(1) A solution of p-tert-butoxystyrene (17.6 g) in 1,4-dioxane containing catalytic amount 2,2'-azobis(methyl 2-methylpropionate) was polymerized at 80° C. for 6 hours under nitrogen. After cooling, the reaction mixture was poured into aqueous methanol (1 l) and the polymer was precipitated. The polymer was filtered, washed with methanol and dried under reduced pressure to afford 16.7 g of poly(p-tert-butoxystyrene) as white powder having Mw 20000 (GPC with polystyrene calibration).

(2) A solution of poly(p-tert-butoxystyrene) (15.0 g) obtained in above (1) and conc. hydrochloric acid (20 ml) in 1,4-dioxane was reacted for 4 hours at 7°–80° C. with stirring. After cooling, the reaction mixture was poured into $H_2O$ (1 l) and the polymer was precipitated. The polymer was filtered, washed with $H_2O$ and dried under reduced pressure to give 11.0 g of poly(p-tert-butoxystyrene/p-hydroxystyrene) as white powder. The polymer was found to have p-tert-butoxystyrene unit and p-hydroxystyrene unit in a molar ratio of ca. 5:95 based on $^1$HNMR.

(3) To a solution of poly(p-tert-butoxystyrene/p-hydroxystyrene) (8.0 g) obtained in above (2) and ethyl vinyl ether (2.0 g) in 1,4-dioxane (70 ml), a catalytic amount of pyridinium p-toluenesulfonate was added and reacted with stirring at room temperature for 24 hours. The reaction mixture was poured into $H_2O$ (2 l) and the polymer was precipitated. The precipitate was filtered, washed with $H_2O$ and dried under reduced pressure to afford 9.6 g of poly[p-(1-ethoxyethoxy)styrene/p-hydroxystyrene/p-tert-butoxystyrene] as white powder having Mw 20000 (GPC with polystyrene calibration). The polymer was found to have (1-ethoxyethoxy) styrene unit, p-hydroxystyrene unit and p-tert-butoxystyrene unit in a molar ratio of ca. 35:60:5 based on $^1$HNMR.

Synthesis Example 12 Synthesis of poly[p-(1ethoxyethoxy) styrene/p-hydroxystyrene/p-methylstyrene]

(1) Using p-tert-butoxystyrene (100 g, 0.567 mole) and p-methylstyrene (3.54 g, 0.03 mole), the polymerization and treatment were carried out in the same manner as described in Synthesis Example 11-(1) to give 92.3 g of poly(p-tert-butoxystyrene/p-methylstyrenen) as white powder having Mw 20000 (GPC with polystyrene calibration). The polymer was found to have p-tert-butoxystyrene unit and p-methylstyrene unit in a molar ratio of ca. 95:5 based on 1HNMR.

(2) Using poly(p-tert-butoxystyrene/p-methyl-styrene) (70 g) obtained in above (1), the reaction was carried out in the same manner as described in Synthesis Example 11-(2), and the precipitate was filtered, washed with $H_2O$ and dried under reduced pressure to afford 47.6 g of poly(p-hydroxystyrene/p-methylstyrene) as white powder. The polymer was found to have p-hydroxystyrene unit and p-methylstyrene unit in a molar ratio of ca. 95:5 based on $^1$HNMR.

(3) Using poly(p-hydroxystyrene/p-methylstyrene) (15.0 g) obtained in above (2) and ethyl vinyl ether (3.5 g), the reaction was carried out in the same manner as described in Synthesis Example 11-(3), and the precipitate was filtered, washed with $H_2O$ and dried under reduced pressure to give 11.5 g of poly[p-(1-ethoxyethoxy)styrene/p-hydroxystyrene/p-methylstyrene] as white powder having Mw 20000 (GPC with polystyrene calibration). The polymer was found to have p-(1-ethoxyethoxy)styrene unit, p-hydroxystyrene unit and p-methylstyrene unit in a molar ratio of ca. 35:60:5 based on $^1$HNMR. Synthesis Example 13 Synthesis of 1,3,5-tris(isopropoxymethoxy)benzene (1) A current of dry hydrogen chloride was passed into a mixture of 75% paraformaldehyde (95.1 g, 2.38 mole) and isopropanol (150.2 g, 2.50 mole) until saturated. After stirring for 1 hour at room temperature, the reaction mixture was separated. The oily layer obtained was dried over anhydrous $CaCl_2$ and drying agent was filtered off. The filtrate was distilled under reduced pressure to give 190 g of isopropoxymethylchloride as colorless oil having a boiling point of 36–39° C./80 mmHg.

$^1$HNMR δppm ($CDCl_3$): 1.16–1.24 (6H, d, $CH_2$×2), 4.01–4.10 (1H, m, CH), 5.55 (2H, s, $CH_2$).

(2) To a solution of phloroglucinol (16.7 g, 103.2 mmole) in pyridine (16.3 g, 206.4 mm ole), acetic anhydride (21.1 g, 206.4 mmole) was added dropwise at 20°–30° C., and reacted with stirring for 5 hours at room temperature. After standing at room temperature overnight, the reaction mixture was poured into $H_2O$ (400 ml) and extracted with ethyl acetate (100 ml×3), the organic layer was washed with $H_2O$ (100 ml×5) and dried over anhydrous $MgSO_4$. The drying agent was filtered off. The filtrate was evaporated in vacuo to give 10.6 g of yellow oil as residue. The residual yellow oil was found to have a mixture comprising monoacetyl compound and diacetyl compound, based on $^1$HNMR.

(3) A solution of the mixed acetyl compounds (10.6 g) obtained in above (2) in N,N-dimethylformamide (25 ml) was added dropwise to a suspension of sodium hydride (60% in oil, 5.65 g, 0.14 mole) in toluene (55 ml) at 35° C. or lower under nitrogen stream, and stirred for 2 hours at room temperature. Then isopropoxymethylchloride (15.0 g, 0.14 mole) obtained in above (1) was added dropwise to a reaction mixture at 25° C. or lower, and stirred for 3 hours at room temperature. After standing at room temperature overnight, the reaction mixture was poured into ice-cold $H_2O$ (200 ml) and extracted with methylene chloride (250 ml×3). The organic layer was washed with $H_2O$ (200 ml×2) and dried over anhydrous $MgSO_4$. The drying agent was filtered off. The filtrate was evaporated in vacuo to give 10.1 g of a brown oil as residue. The residual oil was found to have a mixture comprising 1-propoxymethoxy-3,5-diacetylbenzene and 1-acetyl-3,5-diisopropoxymethoxybenzene, based on $^1$HNMR.

(4) A suspension of the mixed ether compounds (10.1 g) obtained in above (3) and anhydrous $K_2CO_3$ (30 g) in methanol (120 ml) was reacted with stirring for 7 hours at room temperature. After standing at room temperature overnight, the reaction mixture was poured into $H_2O$ (100 ml), and extracted with ethyl acetate (100 ml×3). The organic layer was washed with $H_2O$ (100 ml×2) and dried over anhydrous $MgSO_4$. The drying agent was filtered off. The filtrate was evaporated in vacuo, and the resultant oil (10.2 g) was purified by column chromatography on silica gel [Wakogel C-200; mfd. by Wako Pure Chemical Industries, Ltd.] with n-hexane/ethyl acetate [1/1 (v/v)] as eluent to afford 4.5 g of 1,3-bis(isopropoxymethoxy)phenol as pale yellow oil.

(5) A solution of 1,3-bis(isopropoxymethoxy)-phenol (1.20 g, 4.4 mmole) obtained in above (4) in N,N-dimethylformamide (10 ml) was added dropwise to a suspension of sodium hydride (60 % in oil, 0.2 g, 5 mmole) in N,N-dimethylformamide (5 ml) at 25° C. or lower under nitrogen stream, and stirred for 2 hours at room temperature. Then isopropoxymethylchloride (3.6 g, 33 mmole) obtained in above (1) was added dropwise to a reaction mixture at 25° C. or lower, and stirred for 3 hours at room temperature. After standing at room temperature overnight, the reaction mixture was poured into $H_2O$ (750 ml) and extracted with ethyl acetate (250 ml×4). The organic layer was washed with 5% NaOH aqueous solution (250 ml×4), then H$_2$O (250 ml×4) and dried over anhydrous MgSO$_4$. The drying agent was filtered off, the filtrate was evaporated under reduced pressure and the residue was chromatographed on silica gel [Wakogel C-200; mfd. by Wako Pure Chemical Industries, Ltd.] with n-hexane/ethyl acetate [10/1→5/1→3/1(v/v)] as eluent to afford 1.16 g of 1,3,5-tris(isopropoxymethoxy)benzene as pale yellow oil.

$^1$HNMR δppm (CDCl$_3$): 1.15–1.20 (18H, d, CH$_2$×3), 3.94–4.03 (3H, m, CH×3), 5.28 (6H, s, CH$_2$×3), 6.41 (3H, s, Aromatic).

Synthesis Example 14 Synthesis of 2,2-bis[4-(1-ethoxyethoxy)phenyl]propane

To a solution of 2,2-bis(4-hydroxyphenyl)propane (32.0 g, 0.14 mole) and vinyl ethyl ether (80.8 g, 1.12 mole) in 1,4-dioxane (130 ml), pyridinium p-toluenesulfonate (2.8 g) was added and reacted with stirring for 6 hours at 20°–25° C. After reaction, ethyl ether (300 ml) and H$_2$O (100 ml) were added to a reaction mixture, stirred for 30 min. at room temperature, and allowed to stand. The organic layer was washed thrice with H$_2$O, dried over anhydrous MgSO$_4$ and evaporated to give 50.8 g of 2,2-bis[4-(1-ethoxy-ethoxy)phenyl]propane as residual pale yellow oil.

$^1$HNMR δppm (CDCl$_3$): 1.18–1.24 (6H, t, CH$_3$CH$_2$×2), 1.47–1.49 (6H, d, CH$_3$CH×2), 1.63 (6H, s, CH$_3$×2), 3.51–3.83 (4H, m, CH$_3$CH$_2$×2), 5.31–5.37 (2H, m, CH×2), 6.87–7.14 (8H, m, Aromatic).

Synthesis Example 15 Synthesis of 2-cyclohexyl-carbonyl-2-(p-toluenesulfonyl)propane (1) To a suspension of magnesium turning (23.9 g, 0.98 atom) in dry ethyl ether, cyclohexylbromide (160 g, 0.98 mole) was added dropwise under mild reflux, followed by reaction with stirring for 1 hour under reflux to afford Grignard reagent. After cooling, the Grignard reagent was added dropwise to a solution of isobutyloyl chloride (95 g, 0.89 mole) in dry ethyl ether at −5–0° C., the resultant mixture was stirred at the same temperature for 3 hours and standed at room temperature overnight. The reaction mixture was poured into H$_2$O, and the organic layer was separated, washed with H$_2$O, dried over anhydrous MgSO$_4$ and evaporated. The residue was distilled under reduced pressure to give 50 g of 1-cyclohexyl-2-methyl-1-propanone as pale yellow oil having a boiling point of 95°–100° C./20 mmHg.

$^1$HNMR δppm (CDCl$_3$): 1.06 (6H, d, CH$_3$×2), 1.12–1.87 (10H, m, cyclohexylic CH$_2$×5), 2.51 (1H, m, cyclohexylic CH), 2.76 (11H, m, CH). IR (Neat) vcm$^{-1}$: 1710 (C=O).

(2) To 1-cyclohexy-2-methyl-1-propanone (47.6 g, 0.31 mole) obtained in above (1), sulfuryl chloride (42 g, 0.31 mole) was added dropwise at 25–35° C. The mixture was stirred at 50° C. for 3.5 hours and then evaporated. The resultant residue was distilled under reduced pressure to give 30.1 g of 2-chloro-1-cyclohexyl-2-methyl-1-propanone as yellow oil having a boiling point of 99–105° C./18 mmHg.

$^1$HNMR δppm (CDCl$_3$): 1.18–1.87 (16H, m, CH$_3$×2 and cyclohexylic CH$_2$×5), 3.13 (1H, m, cyclohexylic CH).

(3) To a solution of 2-chloro-1-cyclohexyl-2-methyl-1-propanone (30.3 g, 0.16 mole) obtained in above (2) in dimethylsulfoxide, sodium p-toluenesulfinate (30.0 g, 0.17 mole) was added and reacted with stirring at 60° C. for 20 hours. The reaction mixture was poured into cold H$_2$O, continued to stir at 0–5° C. for 1 hour. The precipitate was filtered, washed with H$_2$O and dried. The crude solid (18 g) was recrystallized from n-hexane/benzene to give 13.5 g of 2-cyclohexylcarbony-2-(p-toluenesulfonyl)propane as white needles. mp. 123°–123.5° C.

$^1$HNMR δppm (CDCl$_3$): 1.19–1.91 (16H, m, CH$_3$×2 and cyclohexylic CH$^2$×5), 2.45 (3H, s, Ar—CH$_3$), 3.25 (1H, m, cyclohexylic CH), 7.33 (2H, d, J=8 Hz, Aromatic 3-H, 5-H), 7.65 (2H, d, J=8 Hz, Aromatic 2-H, 6-H). IR (KBr-Disk) vcm$^{-1}$: 1705, 1310.

Synthesis Example 16 Synthesis of bis(cyclohexyl-sulfonyl)diazomethane (1) After dissolving sodium azide (22.5 g, 0.35 mole) in a small amount of H$_2$O, the resulting solution was diluted with 90% ethanol aqueous solution (130 ml). To this, a solution of p-toluenesulfonyl chloride (60 g, 0.32 mole) in ethanol (300 ml) was added dropwise at 10°–25° C., followed by reaction at room temperature for 2.5 hours. The reaction solution was concentrated at room temperature under reduced pressure. The resulting oily residue was washed several times with H$_2$O and dried over anhydrous MgSO$_4$. After removing the drying agent by filtration, there was obtained 50.7 g of p-toluenesulfonylazide as colorless oil.

$^1$HNMR δppm (CDCl$_3$): 2.43 (3H, s, CH$_3$), 7.24 (2H, d, J=8 Hz, Aromatic 3-H, 5-H), 7.67 (2H, d, J=8 Hz, Aromatic 2-H, 6-H). IR (Neat vcm$^{-1}$: 2120 (—N$_3$).

(2) To cyclohexanethiol (20.2 g, 0.17 mole), a solution of potassium hydroxide (12.0 g, 0.21 mole) in ethanol (50 ml) was added dropwise at room temperature and mixture was stirred at 30°±5° C. for 30 minutes. Then methylene chloride (18.2 g, 2.14 mole) was added to this mixture and reacted with stirring at 50°±5° C. for 6 hours. After standing at room temperature overnight, the reaction mixture was diluted with ethanol (55 ml) and added sodium tungstate (400 mg). Then 30% hydrogen peroxide (50 g, 0.44 mole) was added dropwise to this solution at 45°–50° C., then reacted with stirring for 4 hours at the same temperature, added with H$_2$O (200 ml) and standed at room temperature overnight. The precipitate was filtered, washed with H$_2$O and dried. The resultant solid (22 g) was recrystallized from ethanol to give 15.5 g of bis(cyclohexylsulfonyl)-methane as white needles. mp. 137°–139° C.

$^1$HNMR δppm (CDCl$_3$): 1.13–2.24 (20H, m, cyclohexylic CH$_2$×10), 3.52–3.66 (2H, m, cyclohexylic CH×2), 4.39 (2H, s, CH$_2$). IR (KBr-Disk) vm$^{-1}$: 1320, 1305.

(3) To a solution of sodium hydroxide (1.7 g) in a 60% ethanol aqueous solution (70 ml), bis(cyclohexylsulfonyl)methane (12.1 g, 0.04 mole) obtained in above (2) was added, then a solution of p-toluenesulfonylazide (8.2 g, 0.04 mole) obtained in above (1) in ethanol (10 ml) was added dropwise at 5°–10° C., followed by reaction at room temperature for 7 hours. After standing at room temperature overnight, the precipitate was filtered, washed with ethanol and dried. The resultant residue (11 g) was recrystallized from acetonitrile to give 8.0 g of bis(cyclohexyl sulfonyl)-diazomethane as pale yellow prisms. mp. 130°–131° C.

$^1$HNMR δppm (CDCl$_3$): 1.13–2.25 (20H, m, cyclohexylic CH$_2$×10), 3.36–3.52 (2H, m, cyclohexylic CH$_2$×2). IR (KBr-Disk) vcm$^{-1}$: 2130 (CN$_2$), 1340, 1320.

Synthesis Example 17 Synthesis of bis(tert-butylsulfonyl)diazomethane (1) Using tert-butylmercaptan (20.5 g, 0.23 mole) in place of cyclohexanethiol, the reaction and treatment were carried out in the same manner as described in Synthesis Example 16-(2). The crude solid obtained was recrystallized from ethanol to give 9.3 g of bis(tert-butylsulfonyl)methane as white needles. mp. 152.5°–155° C.

(2) Using bis(tert-butylsulfonyl)methane (4.0 g, 15.6 mmole), the reaction and treatment were carried out in the same manner as described in Synthesis Example 16-(3), and the crude solid obtained was recrystallized from ethanol to give 2.4 g of bis(tert-butylsulfonyl)diazomethane as pale yellow needles. mp. 121°–121.5° C.

$^1$HNMR δppm (CDCl$_3$): 1.52 (18H, s, CH$_3$×6). IR (KBr-Disk) vcm$^{-1}$: 2120 (CN$_2$), 1330, 1315.

Synthesis Example 18 Synthesis of 9-anthrylpropyl acetate (1) To a suspension of magnesium turning (9.6 g, 0.4 atom) in dry tetrahydrofuran (50 ml), ethyl bromide (24 g, 0.22 mole) was added dropwise under reflux and stirring was continued for 1 hour under reflux. Then 1-chloropropanol (24 g, 0.25 mole) was added dropwise to the mixture under reflux, followed by reaction with stirring for 1 hour under reflux to afford Grignard reagent. After cooling, anthrone (19.4 g, 0.1 mole) was added to the Grignard reagent and the mixture was reacted with stirring for 4 hours under reflux. After cooling, the reaction mixture was poured into saturated ammonium chloride aqueous solution, extracted with ethyl ether, and the ether layer separated was washed with $H_2O$, dried over anhydrous $MgSO_4$ and evaporated. The residue (22.4 g) was chromatographed on silica gel (Wako-gel C-200, manufactured by Wako Pure Chemical Industries, Ltd.) with n-hexane/methylene chloride |20/1→15/1→10/1 (v/v)| as eluent to give 5.6 g of 9-anthracenepropanol as yellow crystals.

(2) Using 9-anthracenepropanol (1.3 g, 5.5 mmole) obtained in above (1), the reaction was carried out in the same manner as described in Synthesis Example 4, and the resultant crude orange crystals (2.1 g) was recrystallized from n-hexane to give 0.9 g of 9-anthrylpropyl acetate as pale yellow needles having a melting point of 107°–109° C.

$^1$HNMR δppm ($CDCl_3$): 2.24 (3H, s, $CH_3COO$—), 2.24–2.30 (2H, m, —$OCH_2CH_2CH_2$—), 3.78–3.84 (2H, t, Ar—$CH\ CH_2$—), 4.33–4.37 (2H, t, —$OCH_2CH_2CH_2$—Ar), 7.54–7.66 (4H, m, Anthracene 2-H, 3-H, 6-H, 7-H), 8.12 (2H, d, J=9 Hz, Anthracene 4-H, 5-H), 8.36 (2H, d, J=9 Hz, Anthracene 1-H, 8-H), 8.46 (1H, s, Anthracene 10-H). IR (KBr-Disk) vcm$^{-1}$: 1728. UV (MeCN) ε(λ=248 rm): 9.14× $10^4$

REFERENTIAL EXAMPLE 5.0 g of each of the polymers obtained in Syntheses Examples 7–12 was dissolved in 15.0 g of propylene glycol monomethylether acetate, and the solution was passed through a 0.1 μm-mesh filter, spin coated on a silicone wafer and heated at 90° C. for 90 seconds to form a 1.0 μm thick polymer film. This polymer film was dipped in a developing solution (2.38% tetramethylammonium hydroxide solution) for 60 seconds according to a puddling method and the solubility of the polymer film was observed. The results are shown in Table 1.

TABLE 1

| Polymers used | Synthesis Example | Solubility in developing solution |
| --- | --- | --- |
| Poly(p-hydroxystyrene) | 7-(2) | Soluble |
| Poly|p-(1-ethoxyethoxy)-styrene/p-hydroxystyrene| | 7-(3) | Hardly soluble |
| Poly{p-|2-(2-methoxy)-propoxy|styrene/p-hydroxystyrene} | 8 | Hardly soluble |
| Poly(p-tert-butoxy-carbonyloxy)styrene/p-hydroxystyrene | 9 | Hardly soluble |
| Poly(p-tert-butoxycarbonyl-methoxystyrene/p-hydroxystyrene) | 10 | Hardly soluble |
| Poly(p-tert-butoxystyrene/p-hydroxystyrene) | 11-(2) | Soluble |
| Poly|p-(1-ethoxyethoxy)-styrene/p-hydroxystyrene/p-tert-bbutoxystyrene| | 11-(3) | Hardly soluble |

TABLE 1-continued

| Polymers used | Synthesis Example | Solubility in developing solution |
| --- | --- | --- |
| Poly|p-(1-ethoxyethoxy)-styrene/p-hydroxystyrene/p-methylstyrene| | 12-(3) | Hardly soluble |

As is seen from Table 1, the polymers of Synthesis Examples 7-(2) and 11-(2) are the resins soluble in alkali developing solution, and the polymers of Synthesis Examples 7-(3), 8, 9, 10 and 11-(3) are the resins hardly soluble in alkali developing solution.

EXAMPLE 1

A resist composition was prepared from the following components and a pattern was formed in the manner described below by using this resist composition.

| | |
| --- | --- |
| Poly|p-(1-ethoxyethoxy)styrene/p-hydroxystyrene| |Polymer of Synthesis Example 7-(3)| | 5.0 g |
| 2-cyclohexylcarbonyl-2-(p-toluenesulfonyl)propane |Acid generater of Synthesis Example 15| | 0.3 g |
| 9-(2-methoxyethoxy)methylanthracene | 0.06 g |
| Propylene glycol monomethylether acetate | 14.7 g |

Pattern formation using the above resist composition is explained with reference to FIG. 1.

On a high-reflectance aluminum substrate 1 having level differences obtained by subjecting a silicon substrate to photolithography, ethching and aluminum spattering, the above resist composition 2 was spin coated and prebaked on a hot plate at 90° C. for 90 seconds to obtain a 1.0 μm thick resist film (FIG. 1A). This resist film was selectively exposed to KrF excimer laser light (NA 0.50) 3 (248.4 nm) through a mask 4 (FIG. 1B). Then the resist film was post-exposure-baked on a hot plate at 100° C. for 90 seconds and developed with an alkali developing solution (2.38% tetramethyl-ammonium hydroxide solution) for 60 seconds, dissolving away only the exposed portion of the resist composition 2 to obtain a positive pattern 2a (FIG. 1C). This positive pattern had a 0.25 μm line-and-space resolving performance and a good rectangular shape. The intensity of exposure was 35 mJ/cm$^2$.

EXAMPLE 2

A resist composition was prepared from the following components:

| | |
| --- | --- |
| Poly(p-tert-butoxystyrene/p-hydroxystyrene) |Polymer of Synthesis Example 11-(2)| | 4.5 g |
| 2,2-bis|4-(ethoxyethoxy)phenyl| propane |Dissolution-inhibiting compound of Synthesis Example 14| | 1.5 g |
| Biscyclohexylsulfonyldiazomethane |Acid generater of Synthesis Example 16| | 0.3 g |
| 9-(2-ethoxyethoxy)methylanthracene |Deep ultraviolet absorber of Synthesis Example 2| | 0.1 g |
| Diethylene glycol dimethyl ether | 13.7 g |

A pattern was formed in the same way as Example 1 by using the above resist composition. There was obtained a positive pattern having a 0.25 μm line-and-space resolving performance and a good rectangular shape. The intensity of exposure was 38 mJ/cm².

EXAMPLE 3

A resist composition was prepared from the following components:

| | |
|---|---|
| Poly(p-vinylphenol) [Polymer of Synthesis Example 7-(2)] | 4.5 g |
| 1,3,5-tris(isopropoxymethoxy)benzene [Crosslinkable compound of Synthesis Example 13] | 1.8 g |
| Bis(tert-butylsulfonyl)diazomethane [Acid generater of Synthesis Example 17] | 0.3 g |
| 9-(2-methoxyethoxy)methylanthracene [Deep ultraviolet absorber of Synthesis Example 1] | 0.07 g |
| Ethyl lactate | 13.4 g |

Pattern formation was carried out in the same way as Example 1 by using the above resist composition. There was obtained a negative pattern having a 0.25 μm line-and-space resolving performance and a good rectangular shape. The intensity of exposure was 36 mJ/cm². Examples 4–11 Resist compositions were prepared from the components shown in Tables 2 and 3 below.

TABLE 2

| Example 4 | Poly{p-[2-(2-methoxy)propoxy]-styrene/p-hydroxystyrene} [Polymer of Synthesis Example 8) | 5.0 g |
|---|---|---|
| | 2-cyclohexylcarbonyl-2-(p-toluenesulfonyl)propane | 0.25 g |
| | 9-ethoxyemthylanthracene [Deep ultraviolet absorber of Synthesis Example 3] | 0.05 g |
| | Ethyl lactate | 14.7 g |
| Example 5 | Poly(p-tert-butoxycarbonyloxy-styrene/p-hydroxystyrene [Polymer of Synthesis Example 9] | 5.0 g |
| | 2-cyclohexylcarbonyl-2-(p-toluenesulfonyl)propane | 0.25 g |
| | 9-anthrylpropyl acetate [Deep ultraviolet absorber of Synthesis Example 18] | 0.07 g |
| | Diethylene glycol dimethyl ether | 14.7 g |
| Example 6 | Poly(tert-butyl p-vinyl-phenoxyacetate/p-hydroxystyrene [Polymer of Synthesis Example 10] | 5.0 g |
| | 2-cyclohexylcarbonyl-2-(p-toluenesulfonyl)propane | 0.25 g |
| | 9-anthrylmethyl acetate [Deep ultraviolet absorber of Synthesis Example 4] | 0.05 g |
| | Methyl 3-methoxypropionate | 14.7 g |
| Example 7 | Poly[p-(1-ethoxyethoxy)styrene/p-hydroxystyrene/p-tert-butoxystyrene [Polymer of Synthesis Example 11-(3)] | 5.0 g |
| | Biscyclohexylsulfonyl-diazomethane | 0.25 g |
| | 9-(2-ethoxyethoxy)methyl-anthracene | 0.07 g |
| | Propylene glycol monomethylether acetate | 14.7 g |

TABLE 3

| Example 8 | Poly[p-(1-ethoxyethoxy)styrene/p-hydroxystyrene/p-tert-butoxystyrene] | 5.0 g |
|---|---|---|
| | 2-cyclohexylcarbonyl-2-(p-toluenesulfonyl)propane | 0.25 g |
| | 9-anthrylmethyl propionate [Deep ultraviolet absorber of Synthesis Example 5] | 0.05 g |
| | Propylene gycol monomethyl-ether acetate | 14.7 g |
| Example 9 | Poly[p-(1-ethoxyethoxy)styrene/p-hydroxystyrene) | 5.0 g |
| | Biscyclohexylsulfonyl-diazomthane | 0.25 g |
| | 9-anthrylmethyl p-methylbenzoate [Deep ultraviolet absorber Synthesis Example 6] | 0.04 g |
| | Propylene gycol monomethyl-ether acetate | 14.7 g |
| Example 10 | Poly[p-(1-ethoxyehtoxy)styrene/p-hydroxystyrene/p-methylstyrene] [Polymer of Synthesis Example 12-(3)] | 5.0 g |
| | Bis(tert-butylsulfonyl)-diazomethane | 0.25 g |
| | 9-(2-methoxyethoxy)methyl-anthracene | 0.07 g |
| | Propylene glycol mono-methylether acetate | 14.7 g |
| Example 11 | Poly(p-tert-butoxystyrene/p-hydroxystyrene) | 4.5 g |
| | 1,3,5-tris(isopropoxy-methoxy)benzene | 1.8 g |
| | Biscyclohexylsulfonyldiazomethane | 0.3 g |
| | 9-(2-ethoxyethoxy)methylanthracene | 0.1 g |
| | Propylene glycol monomethyl-ether acetate | 13.4 g |

Patterns were formed in the same way as Example 1 by using the above resist compositions. The results are shown in Table 4.

TABLE 4

| Example | Exposure | Pattern | Resolution | Shape | Whether effective for preventing halation or not |
|---|---|---|---|---|---|
| 4 | 35 mJ/cm² | Positive | 0.22 μm L/S | Good | Effective |
| 5 | 32 mJ/cm² | Positive | 0.35 μm L/S | Good | Effective |
| 6 | 36 mJ/cm² | Positive | 0.35 μm L/S | Good | Effective |
| 7 | 35 mJ/cm² | Positive | 0.22 μm L/S | Good | Effective |
| 8 | 34 mJ/cm² | Positive | 0.22 μm L/S | Good | Effective |
| 9 | 34 mJ/cm² | Positive | 0.22 μm L/S | Good | Effective |
| 10 | 33 mJ/cm² | Positive | 0.22 μm L/S | Good | Effective |
| 11 | 33 mJ/cm² | Positive | 0.22 μm L/S | Good | Effective |

COMPARATIVE EXAMPLE 1

A resist composition was prepared from the following components same as the composition of Example 1 with the deep ultraviolet absorber according to the present invention being eliminated:

| | |
|---|---|
| Poly[p-(1-ethoxyethoxy)styrene/p-hydroxystyrene] | 5.0 g |
| 2-cyclohexylcarbonyl-2-(p-toluenesulfonyl)propane | 0.3 g |
| Propylene glycol monomethylether acetate | 14.7 g |

A pattern was formed in the same way as Example 1 by using the above resist composition. As a result, the bottom layer of the non-exposed portion was partly dissolved away under the influence of halation and the obtained positive pattern 2'a was faulty (FIG. 2). This defective pattern caused failure in the succeeding steps and thus could not stand practical use. Comparative Examples 2-5

Resist compositions were prepared from the components shown in Table 5, same as the compositions of Examples 2, 3, 5 and 7, respectively, with the deep ultraviolet absorber according to the present invention being eliminated.

TABLE 5

| Comp. Example 2 | Poly(p-tert-butoxystyrene/p-hydroxystyrene | 4.5 g |
| | 2,2-bis[4-(2-ethoxyethoxy)-phenyl]propane | 1.5 g |
| | Biscyclohexylsulfonyldiazomethane | 0.3 g |
| | Diethylene glycol dimethyl ether | 13.7 g |
| Comp. Example 3 | Poly(p-vinylphenol) | 4.5 g |
| | 1,3,5-tris(isopropoxymethoxy)-benzene | 1.8 g |
| | Bis(tert-butylsulfonyl)-diazomethane | 0.3 g |
| | Ethyl lactate | 13.4 g |
| Comp. Example 4 | Poly(p-tert-butoxycarbonyloxy-styrene/p-hydroxystyrene) | 5.0 g |
| | 2-cyclohexylcarbonyl-2-(p-toluenesulfonyl)propane | 0.25 g |
| | Diethylene glycol dimethyl ether | 14.7 g |
| Comp. Example 5 | Poly[p-(1-ethoxyethoxy)styrene/p-hydroxystyrene/p-tert-butoxystyrene] | 5.0 g |
| | Biscyclohexylsulfonyl-diazomethane | 0.25 g |
| | Propylene glycol monomethyl-ether acetate | 14.7 g |

Patterns were formed in the same way as Example 1 by using the above resist compositions. As a result, the bottom layer of the non-exposed portion was partly dissolved away under the influence of halation in each case, and the obtained patterns were faulty like Comparative Example 1. Such defective patterns caused failure in the succeeding steps and thus were unfit for practical use.

As is appreciated from the foregoing, when the composition of the present invention is used as resist for exposure to light such as deep ultraviolet light (300 nm or less) or KrF excimer laser light (248.4 nm) and applied to a high-reflectance substrate or a substrate having level differences made of such material as aluminum, polysilicon, aluminumsilicon, aluminumsilicon-copper, tungsten silicide or the like, it is possible to obtain an excellent pattern with a size of a quarter of a micron without causing notching or halation which tends to invite various problems such as disconnection on the substrate while maintaining high resolving performance and sensitivity. Thus, the present invention provides a great benefit for formation of ultrafine patterns in semiconductor industries.

The resist composition of the present invention is particularly useful for pattern formation by use of deep ultraviolet light or KrF excimer laser light, but it can also as well be applied to pattern formation using electron rays, X-rays or the like.

What is claimed is:

1. A fine pattern forming process comprising the steps of:

(i) coating a resist composition on a semiconductor substrate and heating the obtained coating film;

(ii) exposing the coating film to deep ultraviolet light or KrF excimer laser light through a mask, and (iii) developing the film with an alkali developing solution, wherein the resist composition comprises (a) one of the following substances (i)-(iii):

(i) a resin which becomes alkali-soluble on elimination of protective groups by the action of an acid;

(ii) a combination of an alkali-soluble resin and a compound which becomes alkali-soluble on elimination of protective groups by the action of an acid;

(iii) a combination of an alkali-soluble resin and a compound which is crosslinked with the resin by the action of an acid to make the resin hardly soluble in an alkaline solution;

(b) a photosensitive compound which generates an acid on exposure to light;

(c) an anthracene derivative represented by the following formula:

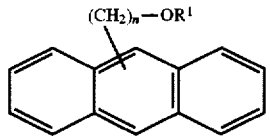

$$(CH_2)_n-OR^1 \quad [1]$$

wherein $R^1$ is an alkyl group having 1–6 carbon atoms, a group represented by the formula:

$$\begin{array}{c} R^2 \\ | \\ -CH-(CH_2)_m-OR^3 \end{array} \quad [2]$$

wherein $R^2$ is a hydrogen atom or an alkyl group having 1–4 carbon atoms, $R^3$ is an alkyl group having 1–6 carbon atoms and m is zero or an integer of 1 to 3; or a group represented by the formula:

$$\begin{array}{c} -C-R^4 \\ \| \\ O \end{array} \quad [3]$$

wherein $R^4$ is an alkyl group having 1–6 carbon atoms, a phenyl group or a substituted phenyl group, and n is an integer of 1–5; and (d) a solvent.

2. A process according to claim 1, which further comprises conducting a heat treatment after the exposure to deep ultraviolet light or KrF excimer laser light in the step (ii).

* * * * *